(12) United States Patent
Brimhall et al.

(10) Patent No.: US 6,456,720 B1
(45) Date of Patent: Sep. 24, 2002

(54) FLEXIBLE CIRCUIT BOARD ASSEMBLY FOR A HEARING AID

(75) Inventors: Owen D. Brimhall, South Jordan; Carl E. Ellis; Jerry L. Pauley, both of Salt Lake City; Craig M. Collotzi, Sandy, all of UT (US)

(73) Assignee: Sonic Innovations, Salt Lake City, UT (US)

( * ) Notice: Subject to any disclaimer, the term of this patent is extended or adjusted under 35 U.S.C. 154(b) by 0 days.

(21) Appl. No.: 09/468,769

(22) Filed: Dec. 10, 1999

(51) Int. Cl.[7] .............................................. H04R 25/00
(52) U.S. Cl. ........................ 381/324; 381/322; 381/323
(58) Field of Search ................................. 381/312, 314, 381/322, 323, 324, 328; 181/129, 130, 135; 29/896.21; 600/25

(56) References Cited

U.S. PATENT DOCUMENTS

| | | | |
|---|---|---|---|
| 3,665,122 A | 5/1972 | Weiss | 179/107 BC |
| 4,375,016 A | 2/1983 | Harada | 179/182 R |
| 4,553,627 A | 11/1985 | Gastmeier et al. | 181/135 |
| 4,569,812 A | 2/1986 | Werwath et al. | 264/222 |
| 4,739,512 A * | 4/1988 | Hartl et al. | 381/324 |
| 4,756,312 A | 7/1988 | Epley | 128/420.5 |
| 4,879,750 A | 11/1989 | Nassler | 381/68.6 |
| 4,880,076 A | 11/1989 | Ahlberg, et al. | 181/130 |
| 4,937,876 A | 6/1990 | Biërmans | 381/68.6 |
| 5,002,151 A | 3/1991 | Oliveira et al. | 181/130 |
| 5,008,943 A * | 4/1991 | Arndt et al. | 381/324 |
| 5,031,219 A | 7/1991 | Ward et al. | 381/68.6 |
| 5,084,224 A | 1/1992 | Watters | 264/155 |
| 5,099,947 A | 3/1992 | Guggenberger et al. | 181/130 |
| 5,105,904 A | 4/1992 | Olsen | 181/128 |
| 5,166,659 A | 11/1992 | Navarro | 381/68.6 |
| 5,193,116 A * | 3/1993 | Mostardo | 381/324 |
| 5,201,007 A | 4/1993 | Ward et al. | 381/68.6 |
| 5,203,352 A | 4/1993 | Gardner, Jr. | 128/864 |
| 5,293,008 A | 3/1994 | Danielsen | 181/135 |
| 5,327,500 A | 7/1994 | Campbell | 381/68.6 |
| 5,395,168 A | 3/1995 | Leenen | 381/68.6 |
| 5,401,920 A | 3/1995 | Oliveira | 181/135 |
| 5,440,082 A | 8/1995 | Claes | 181/135 |
| 5,463,692 A * | 10/1995 | Fackler | 381/324 |
| 5,682,020 A | 10/1997 | Oliveira | 181/130 |
| 5,701,348 A | 12/1997 | Shennib et al. | 381/68.6 |
| 5,881,159 A | 3/1999 | Aceti et al. | 381/328 |
| 5,915,031 A * | 6/1999 | Hanright | 381/324 |
| 5,920,636 A | 7/1999 | Oliveira et al. | 381/328 |
| 5,996,584 A | 12/1999 | Oliveira et al. | 128/864 |

* cited by examiner

Primary Examiner—Curtis Kuntz
Assistant Examiner—Suhan Ni
(74) Attorney, Agent, or Firm—Lyon & Lyon LLP

(57) ABSTRACT

A circuit board assembly for a hearing device comprises a substrate including a component mounting region that can be folded into a desired orientation. A circuit board assembly constructed in accordance with the present invention can preferably be folded without affecting the performance characteristics of the substrate or any of the components mounted to the substrate. In a preferred embodiment a circuit board assembly constructed in accordance with the present invention comprises a first component mounting region adapted to receive a hearing device microphone, a second component mounting region adapted to receive an electronic circuit and a circuit capacitor, a third component mounting region adapted to receive a contact pad, and a fourth component mounting region adapted to receive a programming pad. When folded in accordance with a preferred configuration, the flexible circuit board assembly can be readily inserted into a hearing device housing.

9 Claims, 14 Drawing Sheets

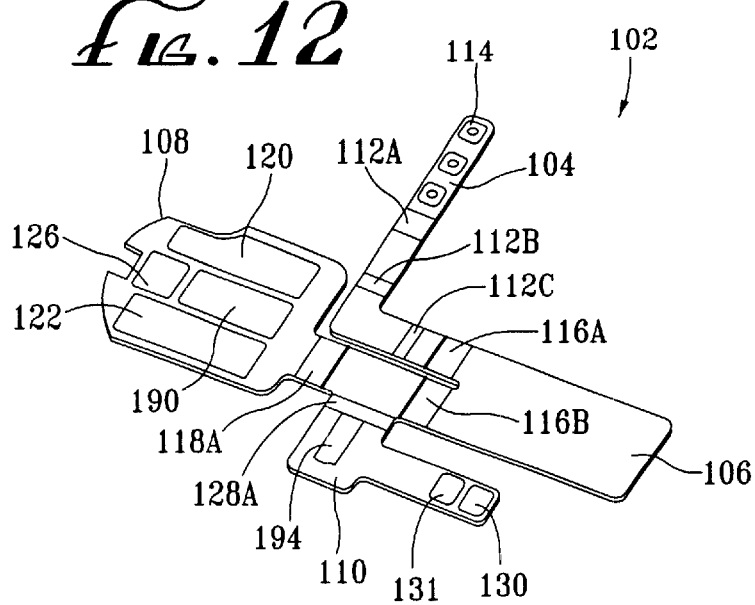
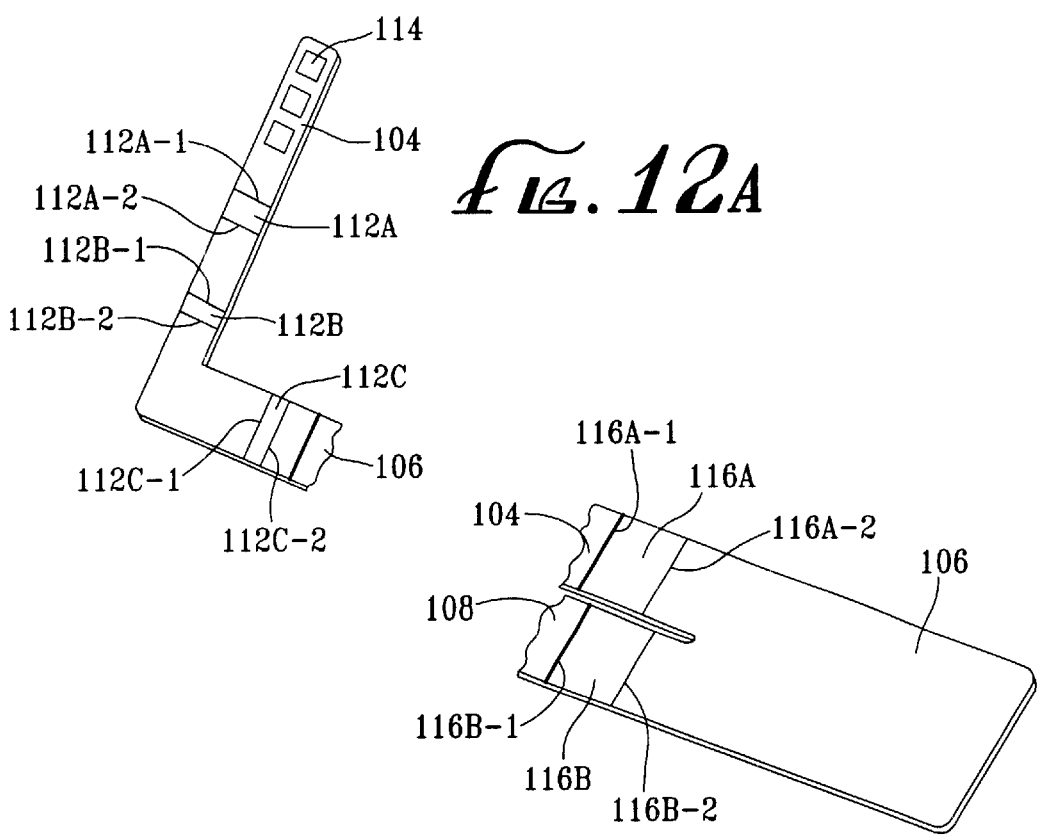

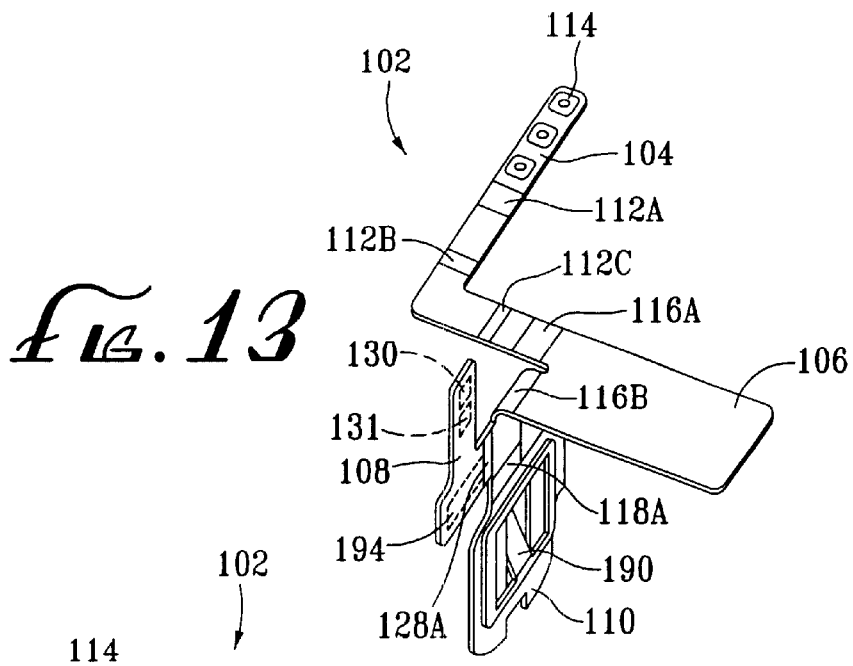
fig.13
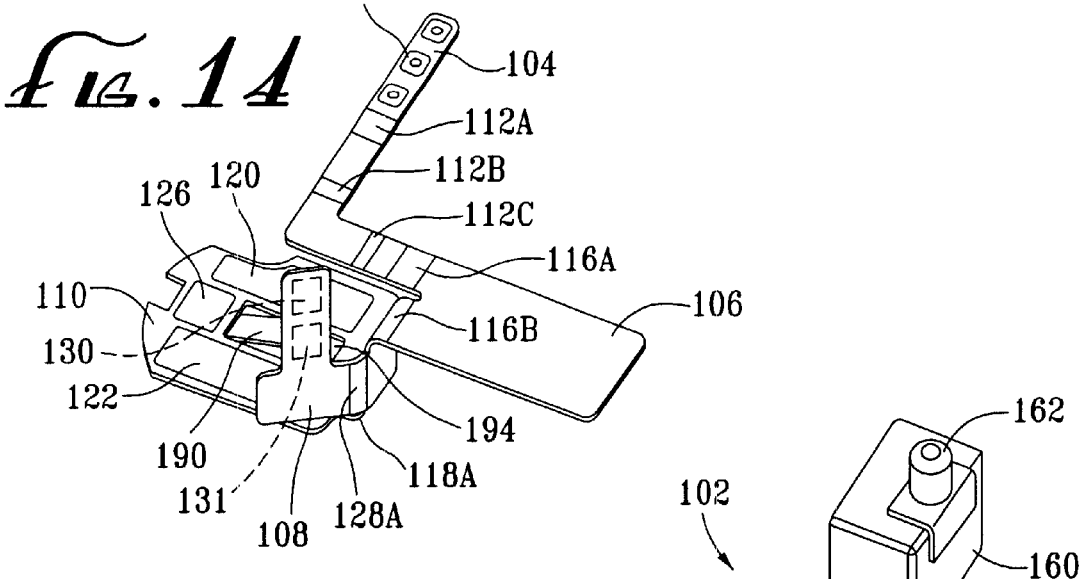
fig.14
fig.15

FLEXIBLE CIRCUIT BOARD ASSEMBLY FOR A HEARING AID

FIELD OF THE INVENTION

The present invention pertains to hearing aids. More particularly, the present invention pertains to flexible circuit board assemblies for use in hearing aids.

BACKGROUND OF THE INVENTION

The modem trend in the design and implementation of hearing devices is focusing to a large extent on reducing the physical size of the hearing device. Miniaturization of hearing device components is becoming increasingly feasible with rapid technological advances in the fields of power supplies, sound processing electronics and micromechanics. The demand for smaller and less conspicuous hearing devices continues to increase as a larger portion of our population ages and faces hearing loss. Those who face hearing loss also encounter the accompanying desire to avoid the stigma and self consciousness associated with this condition. As a result, smaller hearing devices, which are cosmetically less visible, but more sophisticated, are increasingly sought after.

Hearing device technology has progressed rapidly in recent years. First generation hearing devices were primarily of the Behind-The-Ear (BTE) type, where an externally mounted device was connected by an acoustic tube to a molded shell placed within the ear. With the advancement of component miniaturization, modem hearing devices rarely use this Behind-The-Ear technique, focusing primarily on one of several forms of an In-The-Canal hearing device. Three main types of In-The-Canal hearing devices are routinely offered by audiologists and physicians. In-The-Ear (ITE) devices rest primarily in the concha of the ear and have the disadvantages of being fairly conspicuous to a bystander and relatively bulky and uncomfortable to wear. Smaller In-The-Canal (ITC) devices fit partially in the concha and partially in the ear canal and are less visible but still leave a substantial portion of the hearing device exposed. Recently, Completely-In-The-Canal (CIC) hearing devices have come into greater use. As the name implicates, these devices fit deep within the ear canal and are essentially hidden from view from the outside.

In addition to the obvious cosmetic advantages these types of in-the-canal devices provide, they also have several performance advantages that larger, externally mounted devices do not offer. Placing the hearing device deep within the ear canal and close to the tympanic membrane (ear drum) improves the frequency response of the device, reduces distortion due to jaw extrusion, reduces the occurrence of occlusion effects and improves overall sound fidelity. Earlier generation hearing devices function primarily by sound amplification and are typically not altered to user's particular hearing impairment. Modern electronics improvements allow specific sound processing schemes to be incorporated into the hearing device. Similarly, custom programming can be incorporated into the hearing device circuitry allowing a truly custom device for any particular user.

The shape and structure (morphology) of the ear canal varies from person to person. However, certain characteristics are common to all individuals. When viewed in the transverse plane, the path of the ear canal is extremely irregular, having several sharp bends and curves. The overall cross section of the ear canal generally constricts as you move deeper into the ear canal. It is these inherent structural characteristics that create problems for the acoustic scientist and the hearing device designer.

For general discussion purposes, the ear canal can be broken into three main segments. The external and medial segments are both surrounded by a relatively soft cartilaginous tissue. The external segment is largely visible from the outside and represents the largest cavity of the ear canal. The innermost segment of the ear canal, closest to the tympanic membrane, is surrounded by a denser bony material and is covered with only a thin layer of soft tissue. The presence of this bony material allows for little expansion to occur in this region compared with the cartilaginous regions of the ear canal. In addition to being surrounded by cartilage rather than bone, these areas are covered with a substantially thicker tissue layer. Since there is less cushion, pressure exerted by a hearing device on the inner bony region of the canal can lead to discomfort and/or pain, especially when a deep insertion technique is used.

Since the morphology of the ear canal varies so greatly from person to person, hearing aid manufacturers and audiologists use custom manufactured devices in order to precisely fit the dimensions of a user's ear canal. This technique frequently requires impressions of the user's ear canal to be taken. The resulting mold is then used to fabricate a rigid hearing device shell. This process is both expensive and time consuming and the resulting rigid device shell does not perform well during the deformations of the ear canal that occur during normal jaw movement. In order to receive a properly fit hearing device, the user typically has to make several trips to the audiologist for reshaping and resizing. Even after the best possible fit is obtained, the rigid shell rarely provides comfortable hearing enhancement at all times.

Because the resulting hearing aid device shell is typically formed from a hard acrylic material, discomfort to the user is increased when worn for extended periods of time. The inability of the hard shell to conform to normal ear canal deformations can cause it to become easily dislodged from its proper position. Consequently, the quality of the hearing enhancement suffers. Furthermore, due to the added manufacturing costs, it is desirable to utilize a hearing device that is at least partially formed from an off-the-shelf or preformed component readily available to the audiologist or physician.

While the performance of CIC hearing devices are generally superior to other larger and less sophisticated devices, several problems remain. Complications typically arise due to the small size of CIC hearing devices and the depth that they are inserted into a user's ear canal.

Because a CIC hearing device forms an essentially air tight seal between the tip of the hearing device and the wall of the ear canal, discomfort to a user is common. This acoustic seal prevents the equalization of pressure between the internal chamber formed between the tympanic membrane and the hearing device, and the outside environment. Due to the sensitivity of the tympanic membrane, even small pressure differentials can cause severe discomfort. Additionally, since the acoustic seal is formed by pressure exerted by the hearing device, this can also lead to discomfort.

Due to their small size and positioning within the ear canal, CIC hearing devices can cause handling problems, making insertion and removal by a user difficult and cumbersome, and can often lead to damage to the hearing device. In the larger, BTE, or ITC hearing devices, the size of the device usually makes it unnecessary to incorporate a retrieval mechanism into its structure, i.e., the wearer normally will not have any difficulty grasping the device in order to remove it. But in smaller hearing devices, such as a CIC device, retrieval cords and other extraction tools become a necessary addition in order to allow for easy and safe removal by the user.

Manufacturing problems may also arise when dealing with CIC hearing devices. The increased complexity of the sound processing electronics and the frequent need to fit all working components into a single housing, causes physical layout problems for the designer and manufacturer. The need to combine various hearing device elements, i.e., integrated circuits, receiver, microphone, capacitors, wiring, etc. into a single small space ultimately adds to the complexity of the manufacturing operation and the overall cost of the device. It is desirable to simplify the layout of the hearing device components and the manufacturing process to accommodate these complex systems. Designing the hearing device to minimize manual procedures during assembly is also desired in a mass production operation.

Further adding to the complexity of known hearing devices, they are usually formatted to be either a right handed or left handed orientation, specifically formatted for a single ear canal. Known hearing devices are therefore not interchangeable. While being substantially symmetric, the ear canals of an individual are not identical and known hearing devices require specific configurations for each ear. It would be beneficial and cost effective to be able to manufacture a hearing device with a single configuration that could be safely and comfortably used in either ear canal and with a variety of users.

The quality of the microphone system that receives sound waves is also critical to the performance of the hearing device. Interference with the microphone reception due to wind or other extraneous noise can lead to a degradation of sound quality. Additionally, vibrations from within a users ear canal and skull, as well as vibrations generated by the hearing device itself can interfere with the operation of the hearing device electronics, particularly the microphone and receiver system. Known hearing devices do not adequately isolate the microphone and receiver elements within the hearing device in order to shield them from this type of interference.

Finally, it is becoming increasingly important to keep the hearing device, and particularly the internal electronics of the hearing device, shielded from extraneous electromagnetic interference. A common problem arises when using a cellular telephone while wearing a hearing device. Magnetic interference generated by the cellular telephone may interfere with the operation of the hearing device electronics and cause a deterioration in sound quality. Shielding from electromagnetic interference is best accomplished by the use of a metal enclosure. Known hearing devices have not been able to adequately utilize metal enclosures because they typically add to the size of the device. Thin walled metal hearing device shells are therefore desired, particularly in the context of a completely in-the-canal device.

U.S. Pat. No. 5,701,348, entitled "Articulated Hearing Device" ("the '348 patent"), discloses a segmented hearing device with several articulating and non-contiguous parts. The hearing device disclosed in the '348 patent includes a rigid receiver module with a surrounding acoustic seal. The device disclosed in the '348 patent is not applicable for complex electronic hearing device systems incorporated into a CIC hearing device. The device taught by the '348 patent does not provide for all of the hearing device components to be included in a single device housing. Additionally, manufacturing the hearing device of the '348 patent is not conducive to automated processes and does not fully take advantage of the available space in the device housing. A large amount of manual labor is still required to assemble the hearing device of the '348 patent.

SUMMARY OF THE INVENTION

A circuit board assembly in accordance with the present invention solves the foregoing problems by providing a substrate having a component mounting region. The component mounting regions can be folded into a desired orientation with respect to the substrate.

In one aspect, a circuit board assembly constructed in accordance with the present invention is formed from a flexible dielectric substrate comprising a flexible portion adjacent to the component mounting region. The substrate can be folded without affecting the electrical or performance characteristics of the substrate or any components mounted on the substrate.

In another aspect, a circuit board assembly constructed in accordance with the present invention comprises a substrate having a plurality of component mounting regions, wherein each of the component mounting regions can be folded into a desired orientation.

In a further aspect, a circuit board assembly constructed in accordance with the present invention includes a first component mounting region adapted to receive a hearing device microphone, a second component mounting region adapted to receive an integrated circuit and a circuit capacitor, a third component mounting region adapted to receive a contact pad, and a fourth component mounting region adapted to receive a programming pad.

BRIEF DESCRIPTION OF THE DRAWINGS

The drawings illustrate both the design and utility of the preferred embodiments of the present invention, in which similar elements in different embodiments are referred to by the same reference numbers for purposes of ease in illustration of the invention, wherein:

FIG. 12 is a perspective view of a flexible substrate for use in a circuit board assembly constructed in accordance with the present invention;

FIGS. 12A–12D are isolated perspective views of respective component mounting regions of the substrate of FIG. 12;

FIG. 13 is a perspective view of the substrate of FIG. 12, after a first fold has been made;

FIG. 14 is a perspective view of the substrate of FIG. 12, after a second and third fold have been made;

FIG. 15 is a perspective view of the substrate of FIG. 12, after a fourth fold has been made;

DETAILED DESCRIPTION OF THE PREFERRED EMBODIMENTS

Figure 1:
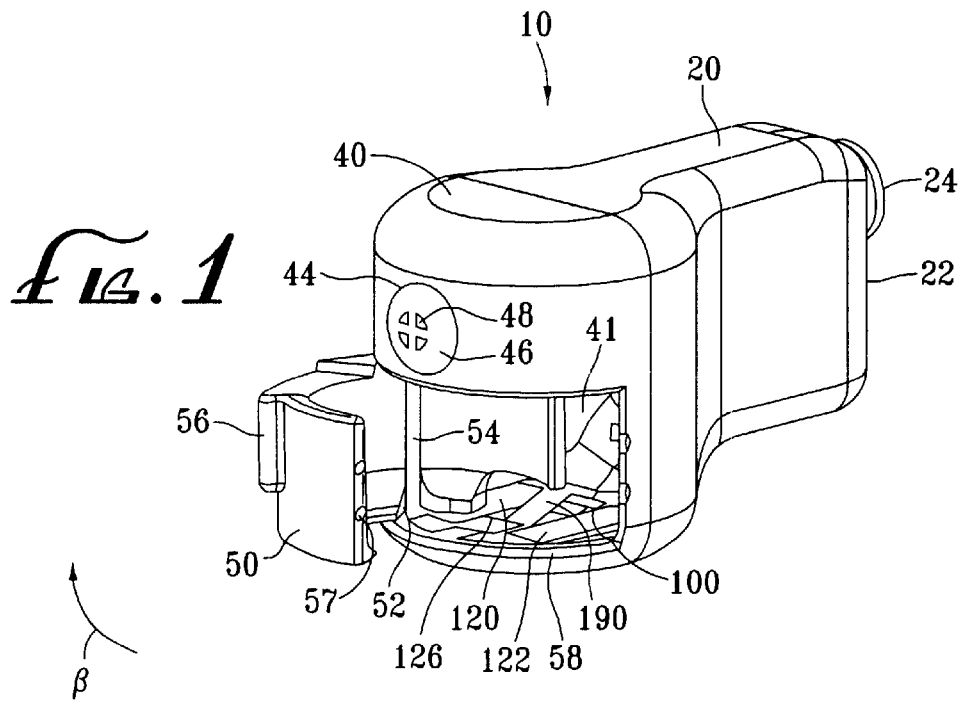
FIG. 1 is a front perspective view of a receiver module utilizing a flexible circuit board assembly constructed in accordance with the present invention.
Figure 2:
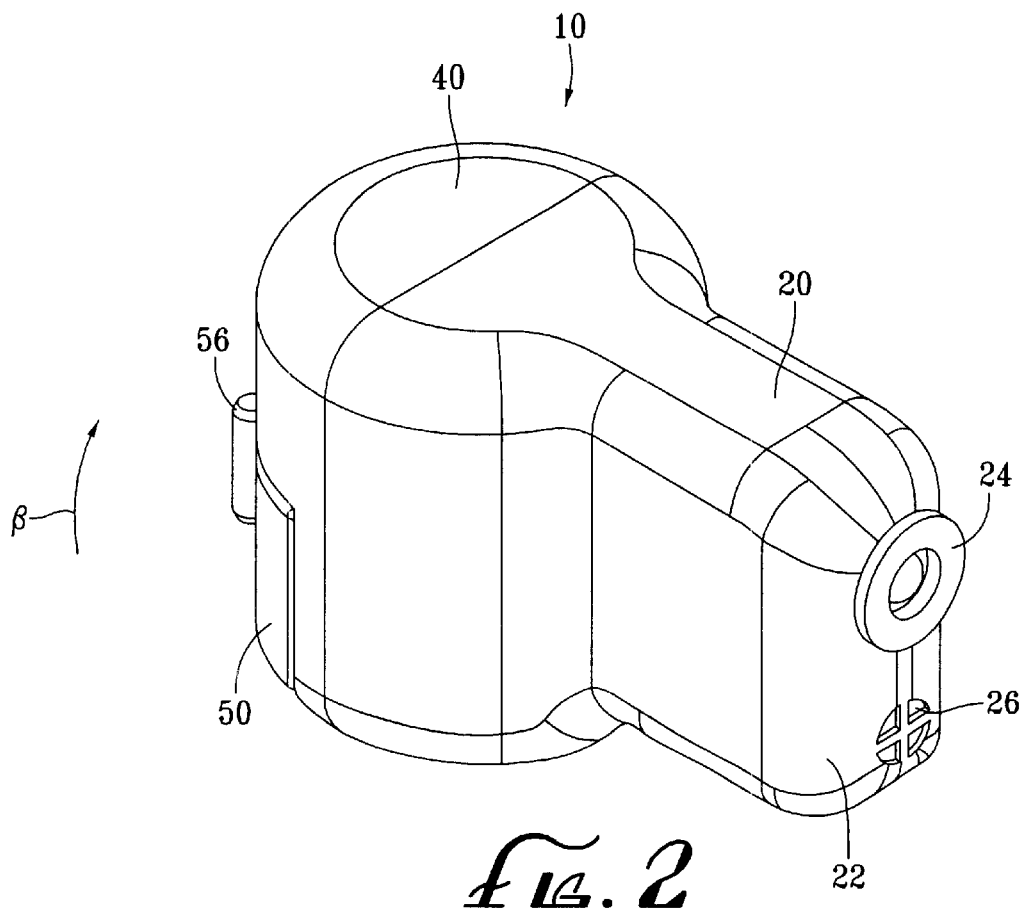
FIG. 2 is a rear perspective view of the receiver module of FIG. 1.
Figure 3:
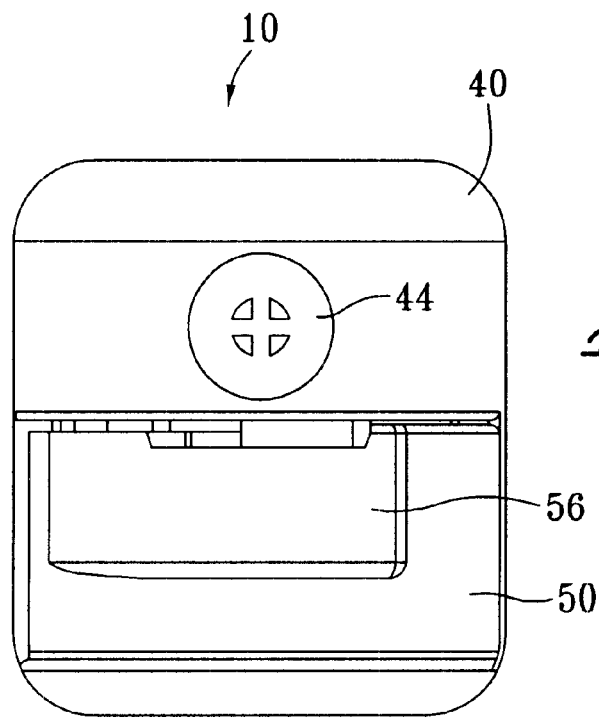
FIG. 3 is a front elevation view of the receiver module of FIG. 1.
Figure 4:
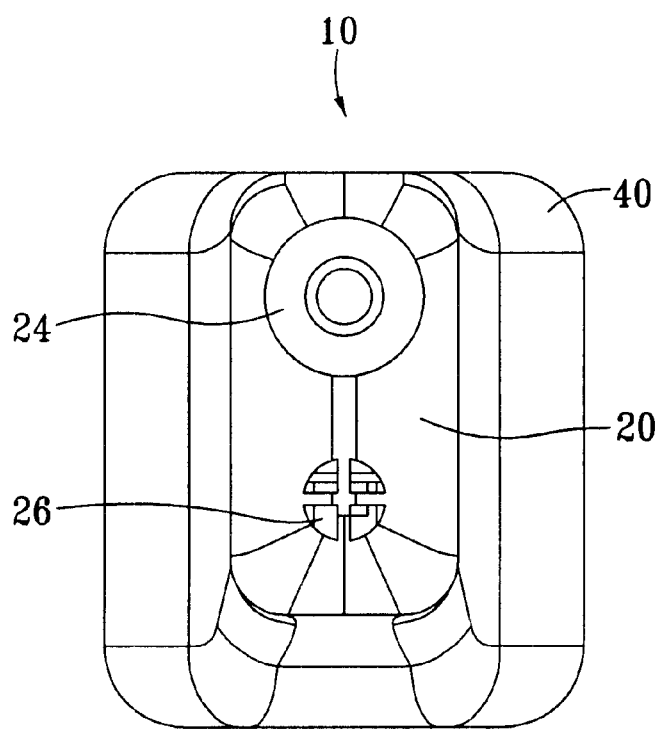
FIG. 4 is a rear elevation view of the receiver module of FIG. 1.
Figure 5:
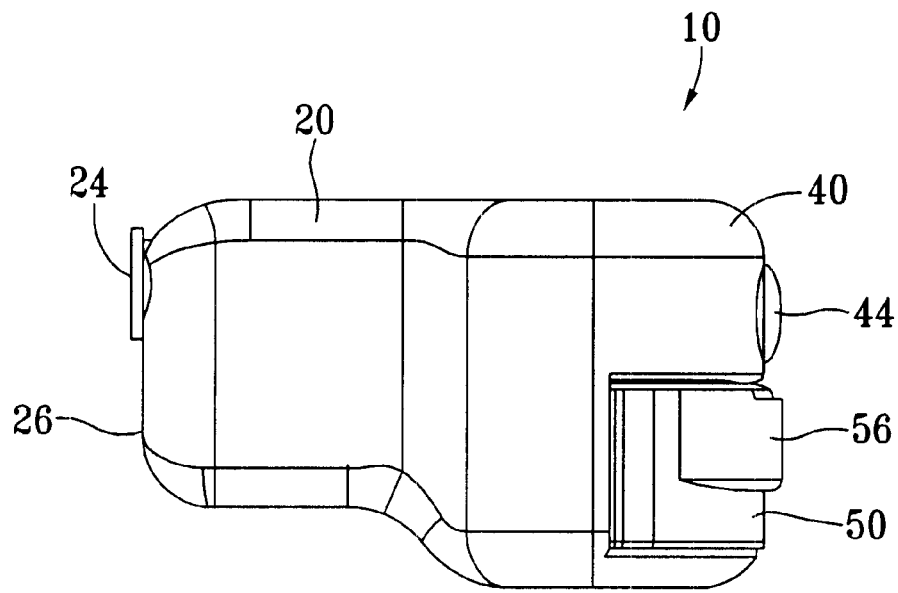
FIG. 5 is a left side elevation view of the receiver module of FIG. 1.
Figure 6:
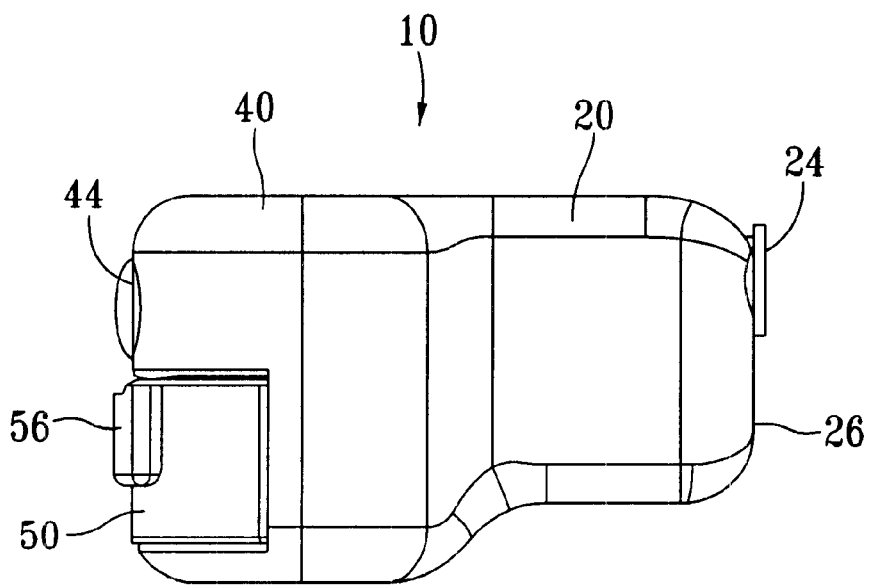
FIG. 6 is a right side elevation view of the receiver module of FIG. 1.
Figure 7:
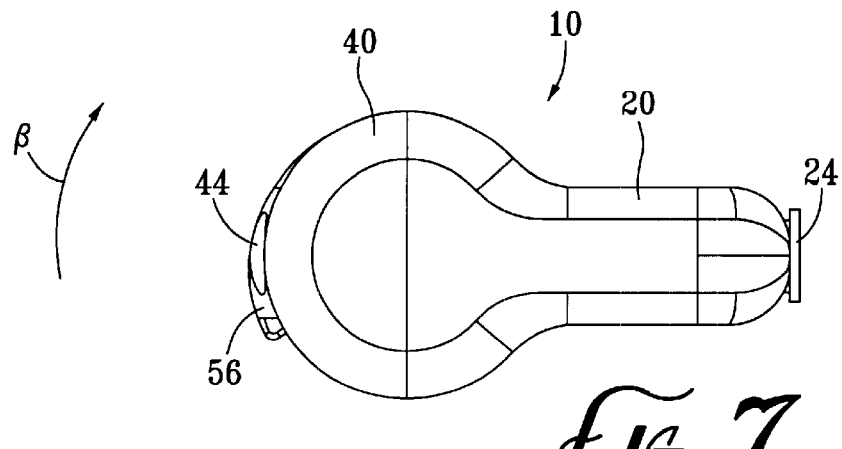
FIG. 7 is a top plan view of the receiver module of FIG. 1.
Figure 8:
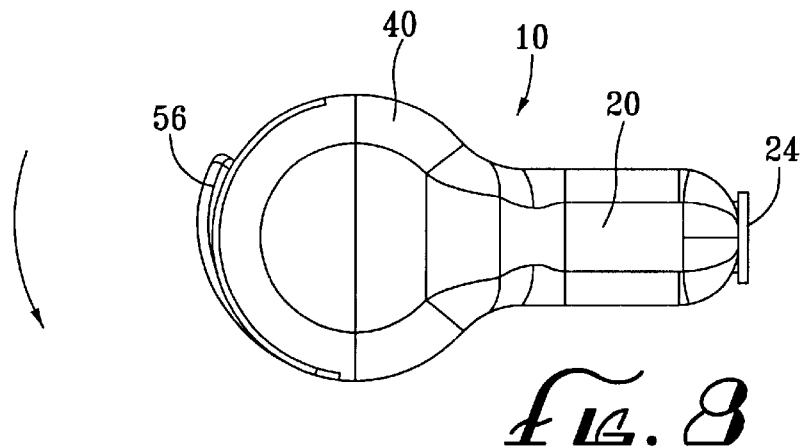
FIG. 8 is a bottom plan view of the receiver module of FIG. 1.

FIGS. 1–10 show various views of a receiver module 10 that is used in conjunction with a completely in-the-canal hearing device. The receiver module 10 comprises a rigid housing that is adapted to contain and protect a variety of hearing device electronics and other operative components, i.e., a hearing device receiver (amplification and speaker system), sound processing circuitry, a microphone, and a power source. Among other features of the receiver module 10, which will be described in more detail below, it protects the sensitive hearing device components from damage due to moisture, dirt, cerumen (ear wax), and user interference. Additionally, the receiver module 10 preferably prevents electromagnetic energy from interfering with the hearing device electronics.

Preferably, the receiver module 10 is used in combination with a conformal hearing aid tip. U.S. patent application Nos. [not yet assigned], filed on the same date as the present application, 09/231,282, filed on Jan. 15, 1999, and 09/231,266, filed on Jan. 15, 1999, each disclose and describe several examples of preferred conformal hearing aid tips, the details of which are hereby fully incorporated by reference into the present application.

The receiver module 10 is preferably formed from two pieces, a distal shell 20 and a proximal faceplate 40. As used herein, the term proximal refers to the portions of a hearing device and its components that are located closer to the exterior, or concha, of an ear canal when the hearing device is inserted. The term distal refers to the portions of a hearing device and its components that are located at a deeper point within an ear canal when a hearing device is inserted. The shell 20 defines an internal chamber 21 and the faceplate 20 defines an internal chamber 41 (Best seen in FIGS. 9 and 10).

The faceplate 40 includes a door 50 that is hingedly attached to the proximal end of the faceplate 40. As best seen in FIG. 1, the faceplate 40 includes a post 54 that engages within a channel 52 on the door 50. The door 50 can thus be rotated about the post 54, allowing access to the chamber 41 through an opening 58, and, therefore, to components stored therein. Notably, when the door 50 is opened, a flexible circuit board assembly 100 that includes several components, such as battery contacts 190 and 126 and programming pads 120 and 122 (described in more detail below), can be accessed.

The door 50 includes a handle 56, so that a user can more easily open and close the door 50. When closed, the door 50 covers the opening 58. Preferably, the door 50 includes a series of ridges 57 that prevent the door 50 from accidental opening, i.e., without some level of force applied. Preferably, the door 50 does not create an air tight seal and thus allows air to vent between a distal vent 26 and the proximal end of the receiver module 10.

Also located in the faceplate 40 is a combined wind screen and microphone suspension 44. The windscreen and microphone suspension 44 includes a dome shaped body 46 on the proximal end of the faceplate 40 and a suspension grommet 47 located within the faceplate 40.

The receiver module 10 is preferably formed from two pieces, a distal shell 20 and a proximal faceplate 40. As used herein, the term proximal refers to the portions of a hearing device and its components that are located closer to the exterior, or concha, of an ear canal when the hearing device is inserted. The term distal refers to the portions of a hearing device and its components that are located at a deeper point within an ear canal when a hearing device is inserted. The shell 20 defines an internal chamber 21 and the faceplate 40 defines an internal chamber 41 (Best seen in FIGS. 9 and 10). The body 46 also prevents dirt and other contaminants from entering the receiver module 10. The grommet 47 suspends the microphone 160 within the chamber 41 defined by the faceplate 40, so that vibrations generated by a user's voice or by the hearing device receiver do not interfere with the operation of the microphone 160.

The grommet 47 aligns the sound port 162 with the wind screen body 46 and the apertures 48. The apertures 48 allow sound waves to pass through the body 46 and into the sound port 162. After the microphone receives the sound waves, they are processed, and amplified through a receiver outlet 24. The receiver outlet 24 is connected to a receiver 150 located within the shell 20. The vent aperture 26 is also located on the distal end 22 of the shell 20. The vent aperture 26 allows pressure equalization between the inner regions of the ear canal and the outside environment. Additionally, the vent aperture 26 reduces occlusion effects by allowing sound waves generated within a users own head to propagate to the outside environment rather than resonating within the ear canal.

Since a deep insertion technique is generally preferred when utilizing completely in the-canal hearing devices, the hearing device is preferably positioned in the narrowest parts of the ear canal. Thus, the shell 20 preferably has a narrower lateral cross-section than the faceplate 40. Particularly in relation to the faceplate 40, the shell 20 is tapered at a distal end 22. Since many of the operative electronics of the hearing device are located within the shell 20, it is preferable to form the shell 20 from a rigid material that will stand up to substantial pressures exerted by the ear canal wall, as well as potential damage due to handling by a user.

Additionally, since several of the components located within the shell 20 are susceptible to interference by electromagnetic waves given off by items such as cell phone, radios, etc., the shell 20 is preferably constructed from a metal such as stainless steel or aluminum that prevents electromagnetic interference from interfering with the components mounted therein, and will allow a thin construction of the shell 20 without sacrificing strength. Utilizing a metal such as stainless steel or aluminum for the shell 20 allows a smaller device to be constructed, while retaining strength and providing protection from electromagnetic interference. Notably, when a user is adjusting a conformal tip on the receiver housing 10, pressure is exerted on the shell 20. Using a metal shell provides a structure that will not shatter or crack when squeezed by a user.

The faceplate 40 is preferably formed from a biocompatible and hygienic plastic. As discussed above, the faceplate 40 includes a post 54 and an opening 58 to allow access to several of the hearing device components located within the chamber 41 and, more particularly, on the flexible circuit board assembly 100. In FIGS. 1, 2, 7, and 8, the arrow β shows the rotation of the door 50. Since the receiver module 10 is a programmable hearing device, the faceplate 40 is preferably made from a non-conducting material in order to avoid interfering with any electronic programming connectors inserted through the opening 58.

Figure 9:
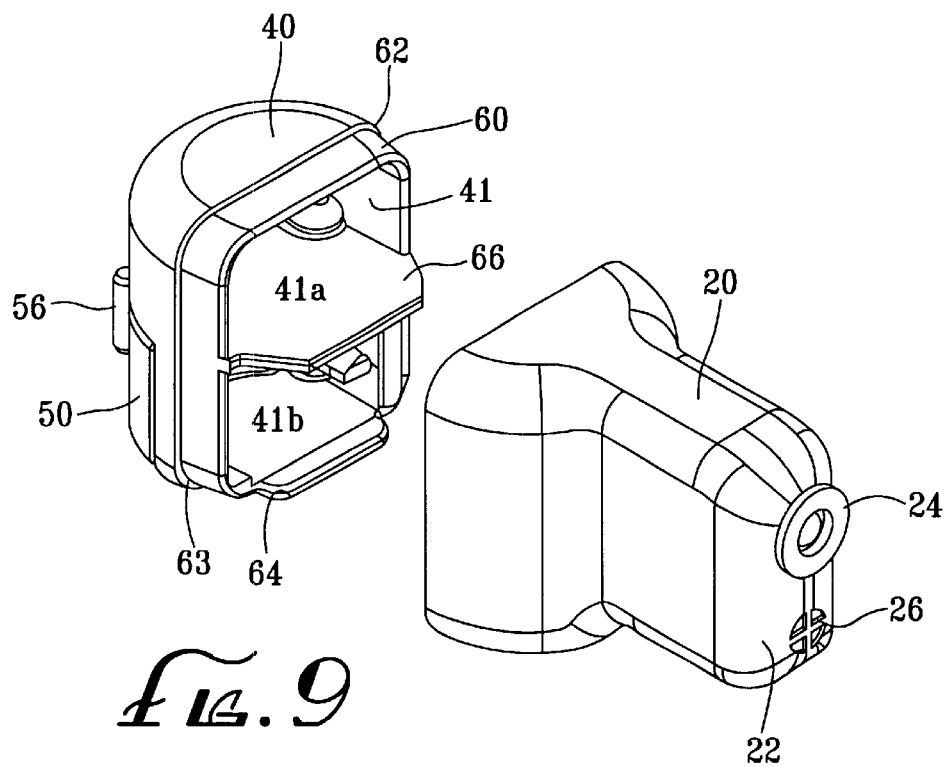
FIG. 9 is an exploded perspective view of the receiver module of FIG. 1.

When assembled, the shell 20 and the faceplate 40 join to form the contiguous receiver module 10 which creates a singular housing for the hearing device components located within the shell 20 and faceplate 40. FIG. 9 shows how the shell 20 and the faceplate 40 align in order to engage with each other. In particular, the faceplate 40 includes a slightly tapered ledge 60 that extends from a peripheral wall 62 of the faceplate 40. A small portion of the peripheral wall 62 is exposed to form a seat 63.

Figure 10:
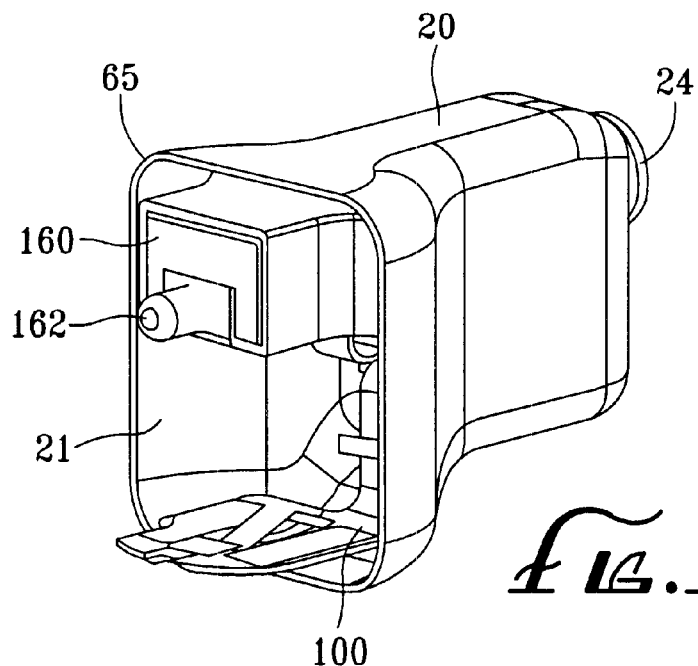
FIG. 10 is a front perspective view of the receiver module of FIG. 9 with the faceplate removed.
Figure 11:
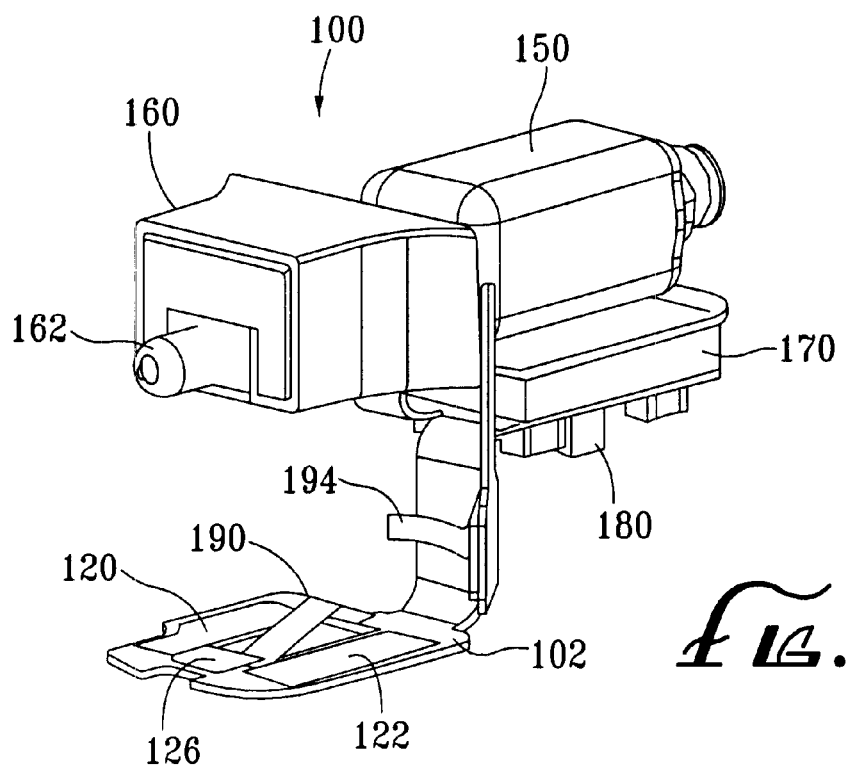
FIG. 11 is a front perspective view of a preferred flexible circuit board assembly constructed in accordance with the present invention.

As seen in FIG. 10, when the shell 20 is engaged with the faceplate 40, a peripheral wall 65 of the shell 20 abuts against the seat 63. A tab 64 extends from a bottom portion of the peripheral wall 62. The tab 64 serves as a key and therefore aids in aligning the faceplate 40 with the shell 20. In this manner, the shell 20 can only be attached to the faceplate 40 in a single orientation that properly aligns the tab 64. The tab 64 also helps to secure the two components together. The tapered extension 60 allows the faceplate 40 to be inserted into the shell 20 and secured in place. Preferably, the faceplate 40 is held engaged to the shell 20 by friction between the extension 60 and the inside of the shell 20, but other fastening systems may be employed and are contemplated by the present invention. For example, notches may be included in the tapered extension 60 that align with recesses in the shell 20. When the faceplate 40 is engaged with the shell 20, the notches engage with the recesses and further secure the faceplate 40 to the shell 20. Squeezing down on the faceplate 40 will disengage the notches from the recesses and allow the faceplate 40 to be removed from the shell 20.

A shelf 66 is provided within the chamber 41 defined by the faceplate 40. The shelf 66 divides the chamber 41 into an upper portion 41a and a lower portion 41b, and isolates the microphone 160 in the upper portion 41a when it is inserted into the faceplate 40. Since a user has access to the lower portion 41b through the door 50, the shelf 66 prevents interference by a user with the operation of the microphone or other sensitive electronics in the upper portion 41a.

FIG. 10 shows the shell 20 with the flexible circuit board assembly 100 installed within the chamber 21. In FIG. 10, the microphone 160 is shown mounted within the chamber 21 and on the flexible circuit board assembly 100 so that when the faceplate 40 engages with the shell 20, the microphone 160 will rest within the chamber 41. The sound port 162 extends from the microphone 160 and is aligned with the apertures 48 on the windscreen and microphone suspension 44.

As seen in FIG. 9, when the shell 20 is engaged with the faceplate 40, a peripheral wall 65 of the shell 20 abuts against the seat 63. A tab 64 extends from a bottom portion of the peripheral wall 62. The tab 64 serves as a key and therefore aids in aligning the faceplate 40 with the shell 20. In this manner, the shell 20 can only be attached to the faceplate 40 in a single orientation that properly aligns the tab 64. The tab 64 also helps to secure the two components together. The tapered extension 60 allows the faceplate 40 to be inserted into the shell 20 and secured in place. Preferably, the faceplate 40 is held engaged to the shell 20 by friction between the extension 60 and the inside of the shell 20, but other fastening systems may be employed and are contemplated by the present invention. For example, notches may be included in the tapered extension 60 that align with recesses in the shell 20. When the faceplate 40 is engaged with the shell 20, the notches engage with the recesses and further secure the faceplate 40 to the shell 20. Squeezing down on the faceplate 40 will disengage the notches from the recesses and allow the faceplate 40 to be removed from the shell 20.

FIG. 12 shows the foldable substrate 102 in a planar configuration prior to attachment of the microphone 160, the integrated circuit 170 and the circuit capacitors 180, and prior to the foldable substrate 102 being folded in accordance with a specific hearing device design. The foldable substrate 102 is preferably formed from a partially or totally flexible dielectric material that is suitable for use in semiconductor circuit board applications and is conducive to known semiconductor manufacturing processes. A preferred example of this type of dielectric substrate is manufactured by Dyconex Technologies under the name DYCOstrate®. 3M Corporation also makes a similar flexible dielectric substrate under the name Kaptons®. The foldable substrate 102 is suitable for receipt of electrical traces, contact pads, solder pads, and other electronic components, electrical connectors, and circuit elements. In addition to its electrical and electronic characteristics, the foldable substrate 102 forms the structural backbone of the flexible circuit board assembly 100.

More particularly, the foldable substrate 102 is configured for the receipt of a particular arrangement of hearing device components such as the microphone 160, the integrated circuit 170, and the circuit capacitors 180. When flly assembled, the foldable substrate 102 and the various components together form the flexible circuit board assembly 100, which can be coupled to the hearing aid receiver 150 in order to finction as a complete hearing amplification and sound processing system. After assembly, the flexible circuit board assembly 100 is formatted to be inserted as a unit into the shell 20 and faceplate 40 forming the receiver module 10.

The flexible circuit board assembly 100 provides a stock configuration with respect to the mechanical and electrical core components of the receiver module 10, which do not need to be modified for a particular individuals ear canal size. A hearing device that utilizes such a flexible circuit board assembly 100 can be physically adjusted in order to fit various ear canal sizes by the use of a soft conformal tip.

By making the construction of the receiver module universal, the receiver module can be easily used in either a right or left ear canal rather than being restricted to a particular ear. With the use of a soft conformal tip, the receiver module can be used in a variety of differently sized ear canals as well, truly making a receiver module constructed in accordance with the present invention universal and in conjunction with a conformal tip, a "one-size-fits-all" hearing device.

Figure 12C:
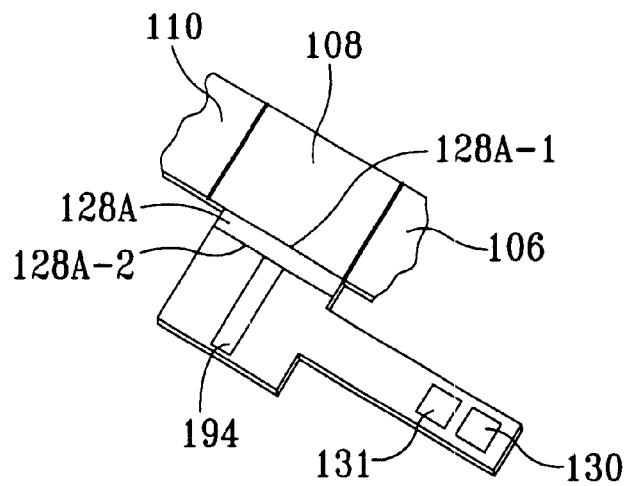
Figure 12D:
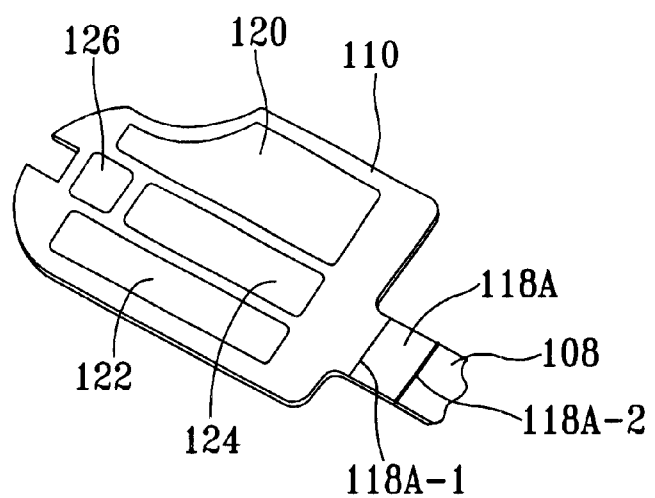

With continuing attention to FIG. 12 and as shown in greater detail in FIGS. 12A–12D, a the foldable substrate 102 includes a first component mounting region 104, a second component mounting region 106, a third component mounting region 108, and a fourth component mounting region 110. Each of the component mounting regions 104, 106, 108, and 110 are interconnected to each other to form the foldable substrate 102. Further, each of the component mounting regions 104, 106, 108, and 110 includes at least one flexible portion defined by etchings in the substrate that allow each of the respective component mounting regions to be folded into a desired configuration without affecting the performance or strength of the foldable substrate 102, or any of the components attached to it.

As shown in FIGS. 12 and 12A, the first component mounting region 104 includes flexible portion 112a, bordered by etchings 112a-1 and 112a-2, flexible portion 112b bordered by etchings 112b-1 and 112b-2, and flexible portion 112c bordered by etchings 112c-1 and 112c-2. The second component mounting region 106, shown in FIGS. 12 and 12B includes flexible portion 116a bordered by etchings 116a-1 and 116a-2, and flexible portion 116b bordered by etchings 116b-1 and 116b-2. The third component mounting region 108, shown in FIGS. 12 and 12C, includes flexible portion 128a bordered by etchings 128a-1 and 128a-2, and the fourth component mounting region 110, shown in FIGS. 12 and 12D, includes flexible portion 118a bordered by etchings 118a-1 and 118a-2.

For ease of illustration, the divisions between the four component mounting regions 104, 106, 108, and 110 are shown in FIGS. 12–12D with a thickened line at etchings 116a-1, 116b-1, and 118a-2. For instance, etching 116a-1 is the border between the first component mounting region 104 and the second component mounting region 106. Etching 116b-1 is the border between the second component mounting region 106 and the third component mounting region 108. Etching 118a-2 is the border between the third component mounting region 108 and the fourth component mounting region 110. It is noted that the configuration of the substrate 102 shown in FIGS. 12–12D is by example only and other arrangements of the several component mounting regions are contemplated by the present invention. With continuing attention to FIG. 12 and as shown in greater detail in FIGS. 12A–12D, the foldable substrate 102 includes a first component mounting region 104, a second component mounting region 106, a third component mounting region 108, and a fourth component mounting region 110. Each of the component mounting regions 104, 106, 108, and 110 are interconnected to each other to form the foldable substrate 102. Further, each of the component mounting regions 104, 106, 108, and 110 includes at least one flexible portion defined by etchings in the substrate that allow each of the respective component mounting regions to be folded into a desired configuration without affecting the performance or strength of the foldable substrate 102, or any of the components attached to it.

During the manufacturing process of the foldable substrate 102, several of the hearing device components are incorporated. In particular, the first component mounting region 104 is provided with three microphone contacts, one for the microphone connection, one for the Regulated Voltage going to the microphone (VREG) connection, and one for a grounding connection. The third component mounting region 108 is provided with two receiver wire contacts 130 and 131, as well as a positive battery contact 194. The fourth component mounting region 110 is provided with programming pads 120 and 122 as well as a negative battery contact 190 and a ground contact 126. Programming pad 120 is preferably for a clock signal (SCLOCK) to the integrated circuit during a programming sequence, and programming pad 122 is preferably for a data signal (SDA) to the integrated circuit during a programming sequence. During the manufacturing process of the substrate 102, the integrated circuit 170 and the circuit capacitors 180 are also attached to the second component mounting region 106.

Figure 12E:
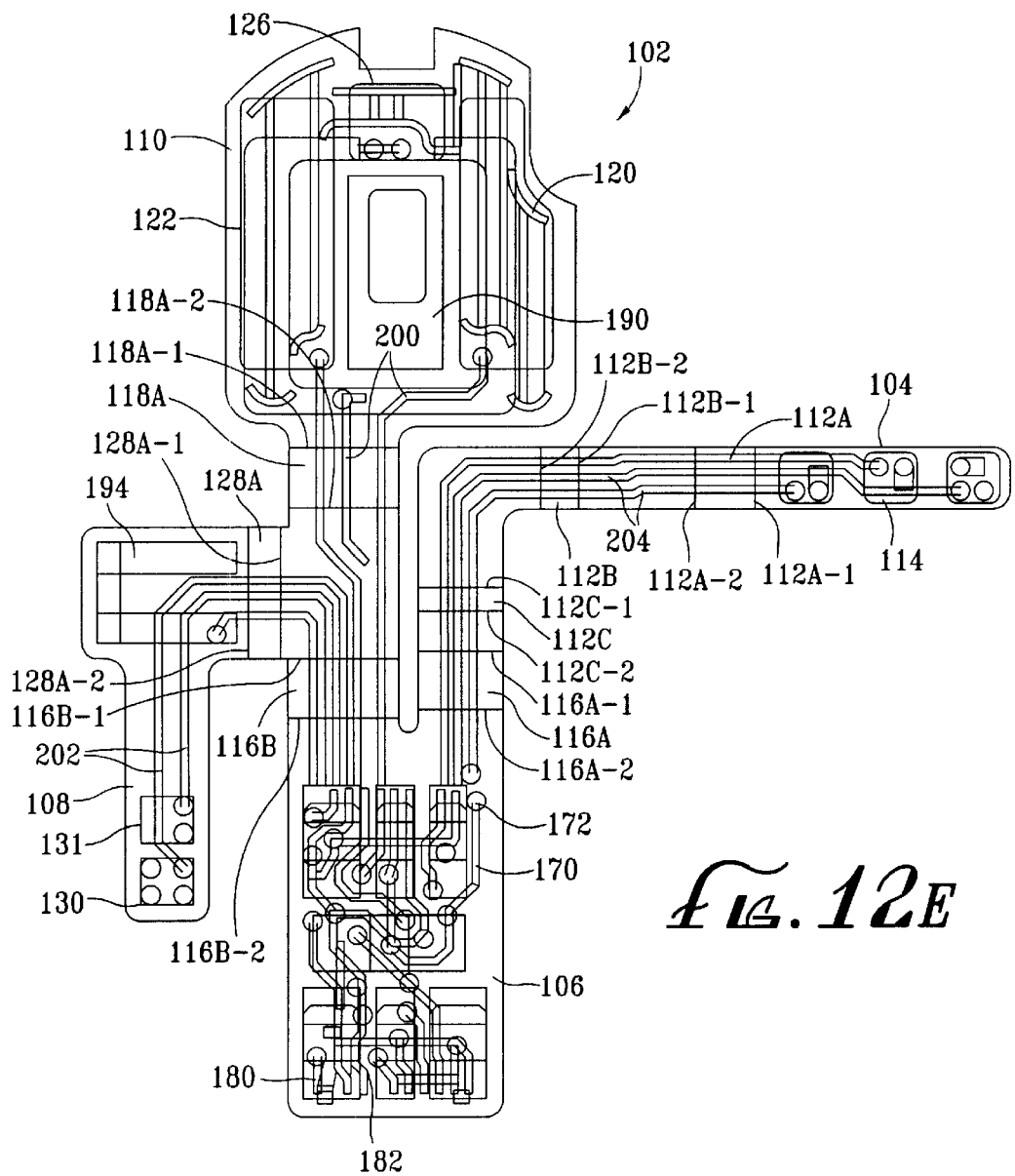
FIG. 12E is a board level schematic of the substrate of FIG. 12.

FIG. 12E shows a board level schematic of a foldable substrate 102. FIG. 12E shows incorporated onto the foldable substrate 102, the various electrical components and connectors as well as the interconnective electrical and electronic pathways between the components and connectors. Together, these elements form a multi-layer flexible circuit board that can be folded into the flexible circuit board assembly 100 in accordance with the present invention. Notably, a series of electrically conductive pathways 200, 202, and 204 interconnect the programming pads 120 and 122, the battery contacts 126, 190, and 194, the microphone contacts 114, the receiver wire pads 130 and 131, the integrated circuit 170, and the circuit capacitors 180. Solder pads 172 and 182 are also included on the foldable substrate 102 in order to facilitate attachment of components such as the integrated circuit 170, the circuit capacitors 180, and the various contact pads. The electrically conductive pathways 200, 202, and 204 are preferably a combination of traces along the surface of the substrate 102, and vias or microvias between the different layers of the substrate 102. Attaching the integrated circuit 170 and the capacitors 180 can be accomplished by a "wire bond" process or by a "flip chip" process, both of which are well known in the field of printed circuit board design and manufacturing. In the context of a flexible substrate, these processes are commonly referred to as "wire bond on flex" and "flip chip on flex". Other types of surface mount (SMT) processes can be used and are contemplated by the present invention.

Referring to FIGS. 13–17, the foldable substrate 102 is shown in various stages as it would preferably be folded, and as hearing device components are preferably incorporated in order to complete the flexible circuit board assembly 100. It is noted that the integrated circuit 170 and the circuit capacitors 180 are preferably incorporated onto the foldable substrate 102 during its initial manufacturing, and prior to the foldable substrate 102 being folded into the flexible circuit board assembly 100. However, for ease of illustration, the integrated circuit 170 and the circuit capacitors 180 are not shown attached to the substrate 102 in FIGS. 13–16.

FIG. 13 shows the foldable substrate 102 after a first fold has been made. In FIG. 13, the flexible portion 116b is bent approximately 90 degrees so that the third component mounting region 108 and the fourth component mounting region 110 are substantially perpendicular to the first component mounting region 104 and the second component mounting region 106. In FIG. 13, the third component mounting region 108 and the fourth component mounting region 110 can be seen from their bottom surface, including the negative battery contact 194.

FIG. 14 shows the foldable substrate 102 after a second and a third fold have been made. First, the flexible portion 118a is bent approximately 90 degrees so that the fourth component mounting region 110 is substantially parallel to the first and second component mounting regions 104 and 106. It is noted however that after the second fold has been made, the fourth component mounting region 110 is in a different plane than the first and second mounting regions 104 and 106 due to the first fold having been previously made. The second fold is made so that the upper surface of the fourth component mounting region 110 is facing in substantially the same direction as it was before the first fold was made.

Next, flexible portion 128a is bent so that the third component mounting region 108, and particularly the surface of the third component mounting region that includes the receiver wire pads 130 and 131, faces toward the fourth component mounting region 110. Preferably, the third component mounting region 108 is bent approximately 45 degrees from its previous position.

FIG. 15 shows the foldable substrate 102 after a fourth fold is made, and how the microphone 160 is installed. In FIG. 15, the flexible portion 116a is bent approximately 90 degrees so that the first component mounting region 104 is substantially perpendicular to the second component mounting region 106. After the fourth fold is made, the microphone 160 is positioned on the first component mounting region 104 so that contacts on the microphone (not shown) align with the contacts pads 114 on the first component mounting region 104. The microphone 160 is preferably bonded onto the first component mounting region 160 in order to ensure a permanent physical and electrical connection.

Figure 16:
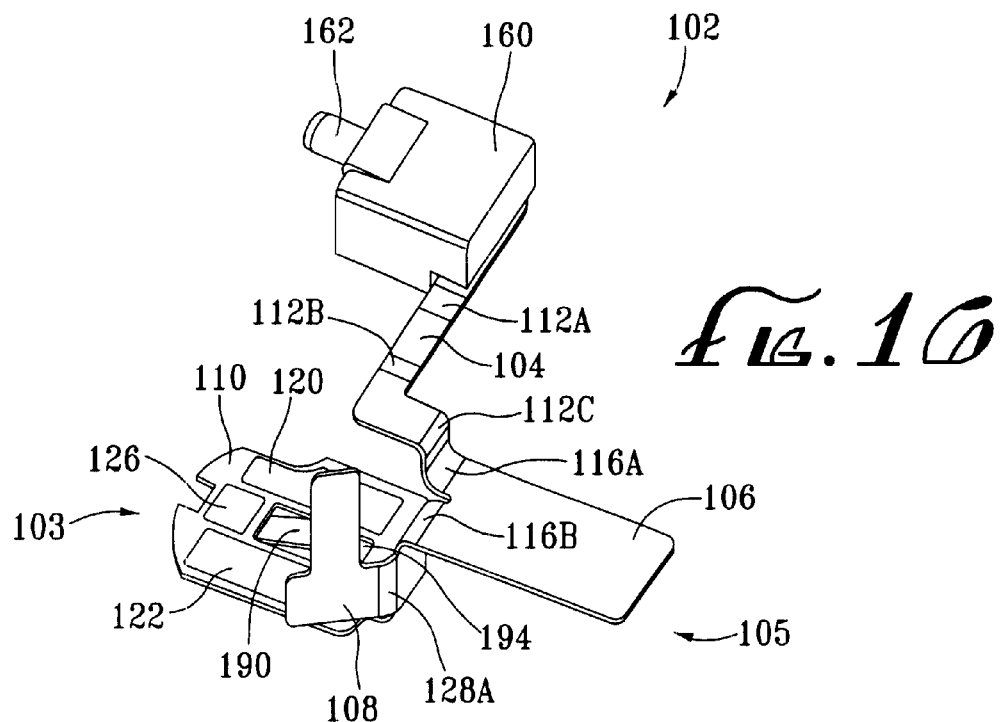
FIG. 16 is a perspective view of the substrate of FIG. 12, after a fifth fold has been made.

FIG. 16 shows the foldable substrate 102 after a fifth fold is made. In FIG. 16, the flexible portion 112c is bent approximately 90 degrees so that the first component mounting region 104 is again parallel to the second and fourth component mounting regions 106 and 110. It is noted however that after the fifth fold is made, the first component mounting region 104 is in a different plane than the first and second mounting regions 104 and 106 due to the previous folds of the substrate 102. After the fifth fold is made, and because the microphone 160 was previously attached to the first component mounting surface 104, the sound port 162 on the microphone 160 faces a proximal end 103 of the foldable substrate 102.

Figure 17:
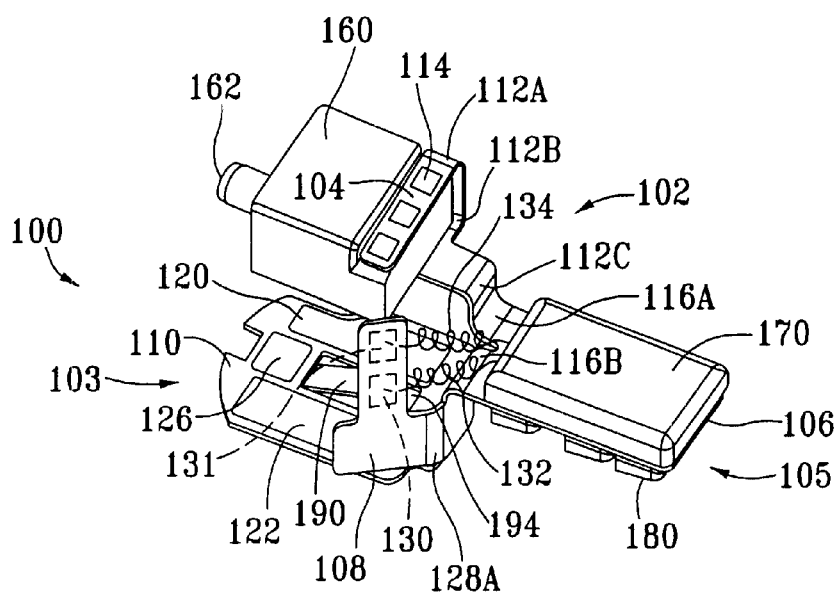
FIG. 17 is a perspective view of the substrate of FIG. 12, after a sixth and seventh fold have been made.

FIG. 17 shows the substrate 102 after a sixth and seventh fold are made. First, flexible portion 112a is bent approximately 90 degrees so that the length of the microphone 160 is substantially perpendicular to its prior orientation. Next, the flexible portion 112b is bent approximately 90 degrees and in the same direction as the previous fold, so that the length of the microphone 160 is in the same orientation as it was before the sixth fold was made. After flexible portions 112a and 112b have been bent, the first component mounting region 104 is wrapped around the microphone 160. Since the microphone has now been flipped 180°, the sound port 162 faces toward the proximal end 103 of the foldable substrate 102. FIG. 17 also shows the integrated circuit 170 and the circuit capacitors 180 attached to the second component mounting region 106 of the substrate 102. As mentioned above, the integrated circuit 170 and the circuit capacitors 180 are preferably attached to the foldable substrate 102 during the manufacturing process of the substrate 102 itself. However, for ease of illustration, the integrated circuit 170 and the circuit capacitors 180 were not shown attached to the substrate 102 in conjunction with FIGS. 13–16.

FIG. 17 shows receiver wires 132 and 134 attached to the receiver wire pads 130 and 131. The receiver wires 132 and 134 lead from the contact pads 130 and 131 to the receiver 150 (not shown). When the hearing device is fully assembled, the receiver 150 is suspended within the shell 20 and preferably does not contact the foldable substrate 102 or the integrated circuit 170. Suspending the receiver 150 within the shell 20 reduces feedback problems and prevents vibrations generated by the hearing device or a user from interfering with the operation of the hearing device. U.S. patent application Nos. [not yet assigned], filed on the same day as the present application, and 09/317,485, filed on May 24, 1999, teach and describe preferred embodiments of such a receiver suspension, the details of which are hereby fully incorporated by reference into the present disclosure. The use of the receiver wires 132 and 134 to connect the receiver contact pads 130 and 131 with the receiver 150, reduces feedback problems by further isolating the receiver 150 from the rest of the hearing device, preventing vibrations generated by the receiver 150 from propagating toward the microphone 160.

The receiver wires 132 and 134 are attached to the receiver wire pads 130 and 131 prior to the foldable substrate 102 being folded. Additionally, the receiver 150 is already attached to the receiver wires 132 and 134. In general it is preferable to make all solder connections to the foldable substrate 102 prior to folding the foldable substrate 102. FIG. 17 and the preceding figures do not show these elements for ease of illustration only.

Figure 18:
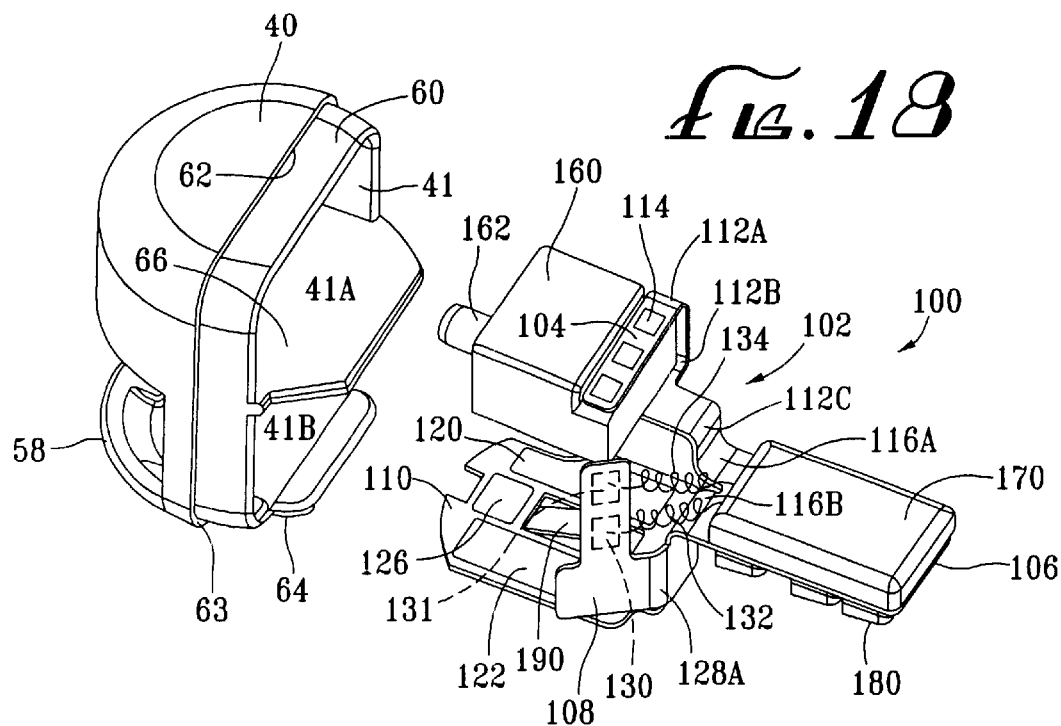
FIG. 18 is a perspective view of the flexible circuit board assembly constructed in accordance with the present invention, as it aligns with a receiver housing faceplate.
Figure 19:
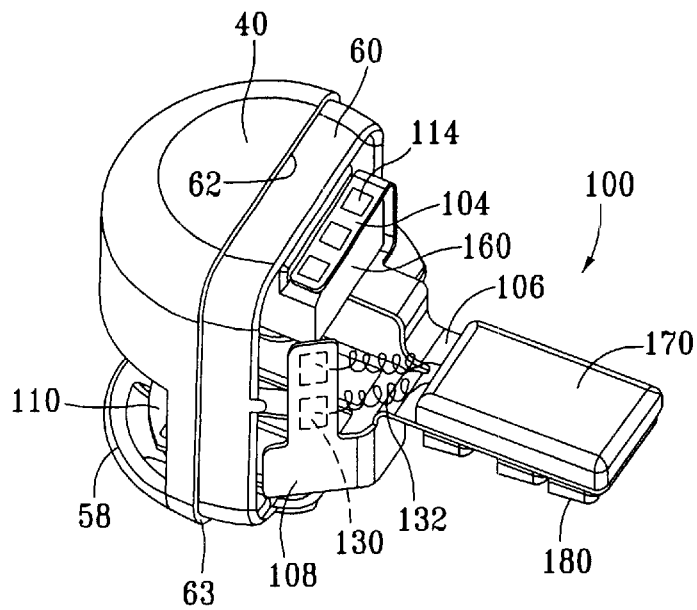
FIG. 19 is a perspective view of the flexible circuit board assembly constructed in accordance with the present invention, as it engages with a receiver housing faceplate.

In FIG. 18 the assembled flexible circuit board assembly 100 is shown as it aligns with the faceplate 40 and prior to being inserted into the faceplate 40. In FIG. 19 the assembled flexible circuit board assembly 100 is shown after being inserted into the faceplate 40. When inserted into the faceplate 40, a shelf 66 within the chamber 41 separates several of the component mounting regions on the flexible circuit board assembly 100. Namely, the first component mounting region 104 and the microphone 160 are positioned within an upper chamber 41a and the fourth component mounting region 110 is within a lower chamber 41b. As best seen in FIG. 19, when the flexible circuit board assembly 100 is inserted into the faceplate 40, the third component mounting region 108 and the second component mounting region 106 extend out of the faceplate 40.

Referring to FIGS. 20–23, the flexible circuit board assembly 100 is shown positioned within the shell 20 and the faceplate 40. As discussed above, the proximal end of the faceplate includes a windscreen and microphone suspension 44. The dome shaped cover 46 along with the apertures 48, prevent noise due to wind or other extraneous noise from interfering with the reception of the microphone 160.

Further, the cover 46 prevent debris, dust, hairspray or other contaminants, from entering the microphone 160, and from potentially interfering with the operation of the hearing device. A suspension grommet 47 extends through the faceplate 40 from the cover 46 and engages with the sound port 162 on the microphone 160. The suspension grommet 47 positions the sound port 162 directly in front of the apertures 48 and directs sound waves into the sound port 162. The suspension grommet 47 also helps secure and align the microphone 160 within the faceplate 40. The microphone 160 is also preferably surrounded by a flexible skirt 164 (Best seen in FIG. 21), that helps position the microphone 160 within the faceplate 40 and ensures that the microphone 160 does not come into contact with the walls of the faceplate 40. The flexible skirt 164 is preferably made from a flexible rubber or polyurethane material and reduces the effects of vibrations on the microphone 160.

Figure 20:
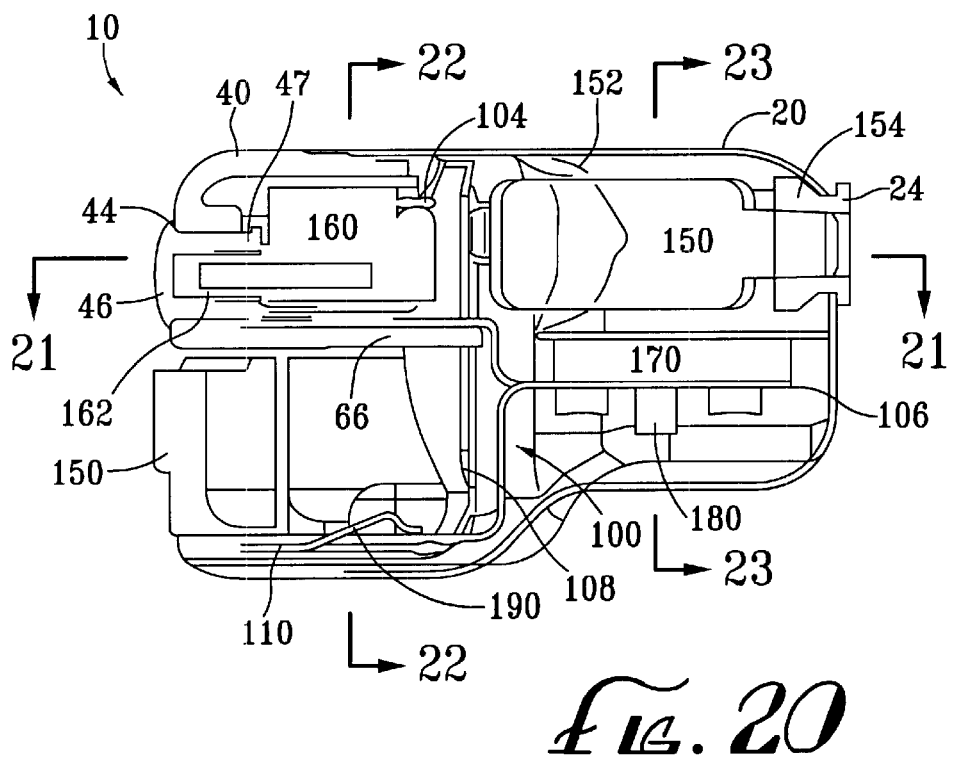
FIG. 20 is a right side longitudinal cross section of a hearing device utilizing a flexible circuit board assembly constructed in accordance with the present invention.

It is noted that the receiver 150 does not contact the flexible circuit board assembly 100 or the components attached to it. In order to reduce feedback effects, the receiver 150 is mounted within the shell 20, by means of a receiver suspension 152 and a receiver grommet 154. The receiver suspension 152 is preferably a skirt that surrounds the receiver 150 and positions the receiver within the shell 20, away from the inner surface of the shell 20. In this manner, the receiver does not directly contact the shell 20, the flexible circuit board assembly 100, or any of the other components within the receiver module 10. Vibrations generated by the receiver 150 are thus prevented from propagating through the hearing device and interfering with the other components, particularly the microphone 160. U.S. patent application No. [not yet assigned], filed on the same day as the present application, discloses and teaches a preferred embodiment of such a receiver suspension, the details of which are hereby fully incorporated by reference into the present application. Also shown in FIG. 20 are the integrated circuit 170, the circuit capacitors 180, the shelf 66, the receiver outlet 24, the first component mounting region 104, and the second component mounting region 106.

Figure 21:
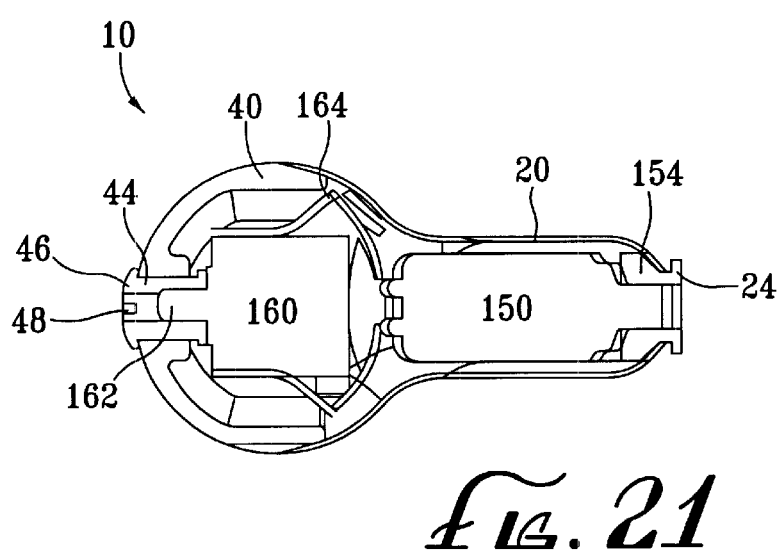
FIG. 21 is a top longitudinal cross section of a hearing device utilizing a flexible circuit board assembly constructed in accordance with the present invention taken at section marks A—A.
Figure 22:
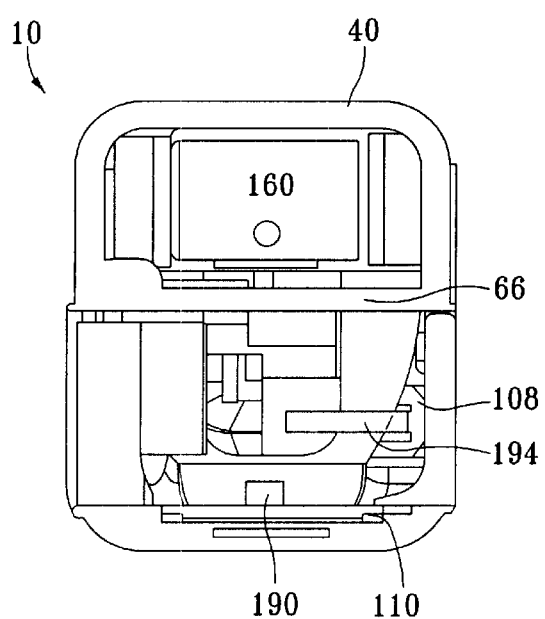
FIG. 22 is a lateral cross section of a hearing device utilizing a flexible circuit board assembly constructed in accordance with the present invention taken at section marks B—B.
Figure 23:
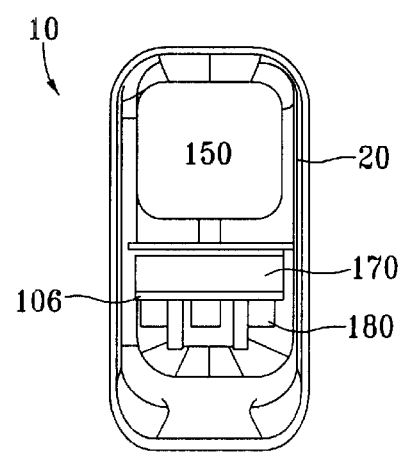
FIG. 23 is a lateral cross section of a hearing device utilizing a flexible circuit board assembly constructed in accordance with the present invention taken at section marks C—C.

FIG. 21 also shows how the sound port 162 engages within the suspension grommet 47 and how the receiver 150 engages within the receiver grommet 154. The receiver grommet 154 further aids in securing the receiver 150 within the shell 20.

When building a hearing device, and particularly a completely in-the-canal hearing device, a flexible circuit board assembly, such as the flexible circuit board assembly 100 described above, is preferably adapted for a mass production or assembly line manufacturing process. The original planar configuration of the flexible circuit board assembly 100 of the present invention lends well to mass production and contributes to reduced cost and manufacturing time.

Figure 24:
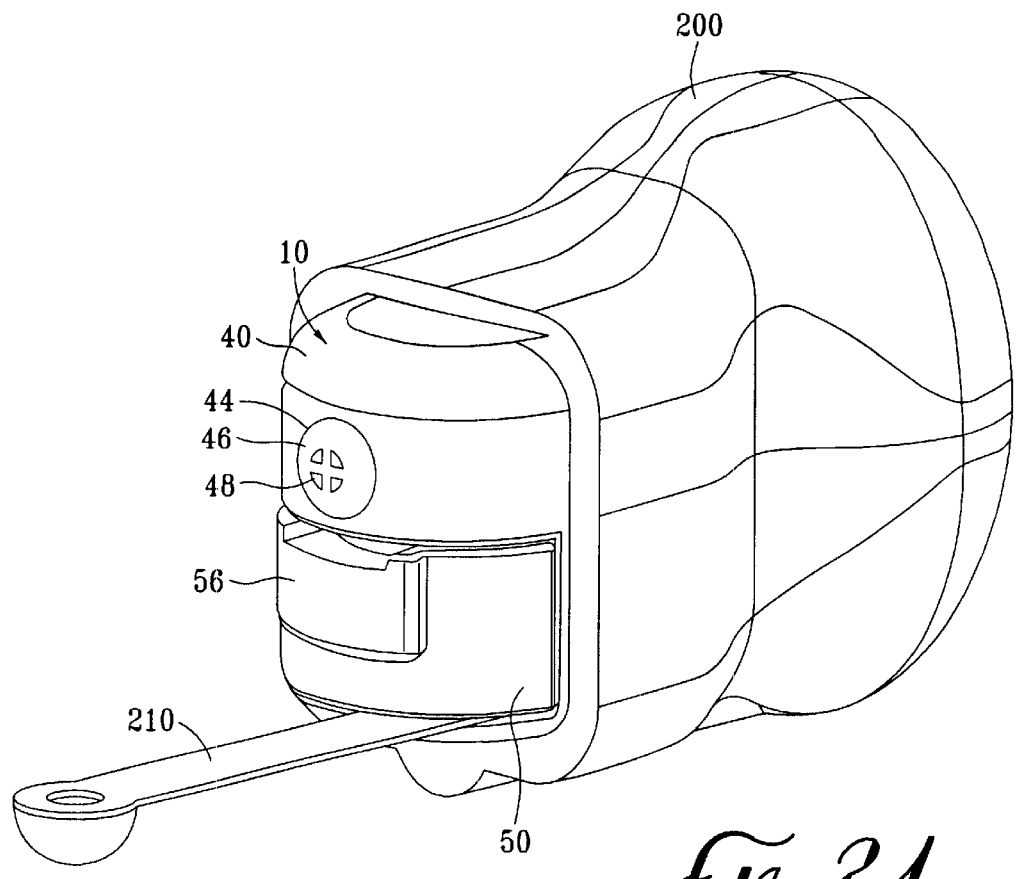
FIG. 24 is a front perspective view of a hearing device utilizing a flexible circuit board assembly constructed in accordance with the present invention engaged with a conformal hearing aid tip.
Figure 25:
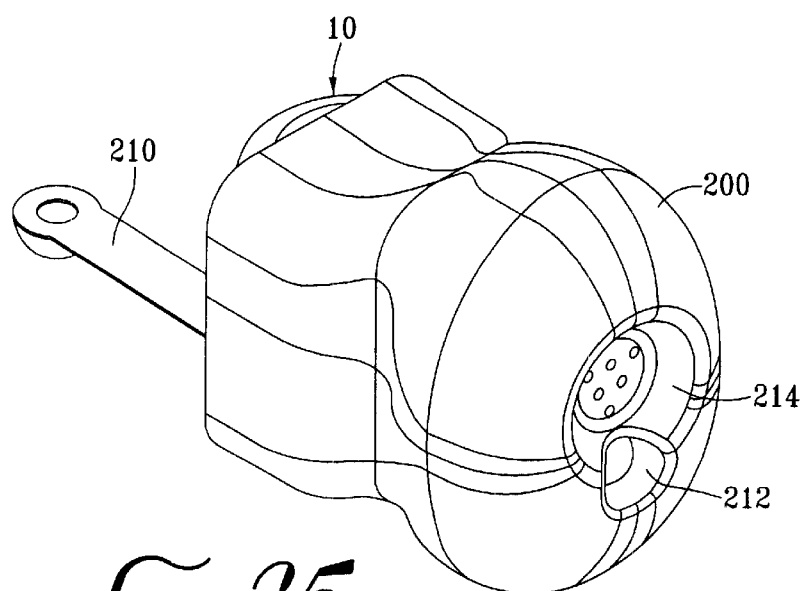
FIG. 25 is a rear perspective view of a hearing device utilizing a flexible circuit board assembly constructed in accordance with the present invention engaged with a conformal hearing aid tip.

A receiver module 10 as described herein, is preferably used in conjunction with a conformal hearing aid tip. FIGS. 24 and 25 depict a receiver module 10 incorporating a flexible circuit board assembly constructed in accordance with the present invention, engaged within a conformal tip 200. The conformal tip 200 is preferably a soft foam sheath with a bulbous end that is adapted to engage with the wall of an ear canal, provide an acoustic seal, and reduce discomfort to the user. U.S. patent application No. [not yet assigned], filed on the same day as the present application, teaches and describes a preferred embodiment of such a conformal tip 200, the details of which are hereby fully incorporated by reference into the present application.

Preferably, the conformal tip 200 includes a retrieval cord 210. Alternately, the retrieval cord 210 can include a vent tube which provides pressure equalization between the inner regions of the ear canal and the outside environment.

Although the invention has been described and illustrated in the above description and drawings, it is understood that this description is by example only and that numerous changes and modifications can be made by those skilled in the art without departing from the true spirit and scope of the invention. The invention, therefore, is not to be restricted, except by the following claims and their equivalents.

What is claimed is:

1. A circuit board assembly for a hearing device, comprising: a single-piece, integrated substrate having a foldable first component mounting region with a microphone contact, a foldable second component mounting region with an electronic circuit and a capacitor, a foldable third component mounting region with a first battery contact and a wire pad, and a foldable fourth component mounting region with a programming pad and a second battery contact, wherein each of the component mounting regions can be folded into a desired compact orientation with respect to the substrate to form a compact circuit board assembly.

2. The circuit board assembly of claim 1, wherein the microphone contact on the first component mounting region is adapted to receive a microphone, and wherein the substrate has a conductive pathway formed thereon, the conductive pathway extending between the microphone contact and the electronic circuit.

3. The circuit board assembly of claim 1, wherein the wire pad on the third component mounting region is adapted to receive an electrical conductor connected to a hearing device receiver, and wherein the substrate has a conductive pathway formed thereon, the conductive pathway extending between the integrated circuit and the wire pad.

4. The circuit board assembly of claim 1, wherein the first battery contact is a positive contact, and wherein the second battery contact is a negative contact.

5. The circuit board assembly of claim 1, wherein the electronic circuit is adapted to process and amplify sounds received through a microphone.

6. The circuit board assembly of claim 1, wherein the substrate has a conductive pathway formed thereon, the conductive pathway extending from the programming pad to the electronic circuit, wherein the electronic circuit is programmable by a user.

7. The circuit board assembly of claim 1, wherein the second component mounting region has first and second mounting surfaces, and wherein the first mounting surface is adapted to receive an integrated circuit, and the second mounting surface is adapted to receive a capacitor.

8. The circuit board assembly of claim 1, wherein the component mounting regions are separated from each other by flexible portions and foldable about the flexible portions in respective directions, and at least one of the component regions is foldable in a direction that is non-coplanar with the foldable direction of at least one other component region.

9. The circuit board assembly of claim 1, wherein any two adjacent component mounting regions are separated by a flexible portion, the flexible portion including an etching that allows each of the component mounting regions to be easily folded about the flexible portion into a desired orientation with respect to the substrate.

* * * * *